United States Patent [19]
Dykes

[11] Patent Number: 5,475,313
[45] Date of Patent: Dec. 12, 1995

[54] PRIMARY CHARGE ROLLER EVALUATOR

[76] Inventor: Wallace E. Dykes, 305 W. Brookhaven Rd., Brookhaven, Pa. 19015

[21] Appl. No.: 309,143

[22] Filed: Sep. 20, 1994

[51] Int. Cl.⁶ .................................................. G01R 31/12
[52] U.S. Cl. ........................ 324/557; 324/511; 324/515; 324/551
[58] Field of Search ................................ 324/557, 511, 324/515, 551

[56] References Cited

U.S. PATENT DOCUMENTS

| | | | |
|---|---|---|---|
| 2,812,491 | 11/1957 | Figlio | 324/557 |
| 3,093,793 | 6/1963 | Hicken | 324/557 |
| 3,359,487 | 12/1967 | Nathan | 324/557 |
| 3,714,455 | 1/1973 | Chepelev . | |
| 3,753,091 | 8/1973 | Daspit | 324/557 |
| 3,798,540 | 3/1974 | Darden . | |
| 4,323,972 | 4/1982 | Winter . | |
| 4,336,494 | 6/1982 | Shindo . | |
| 5,126,913 | 6/1992 | Araya . | |

FOREIGN PATENT DOCUMENTS

| | | | |
|---|---|---|---|
| 1542509 | 10/1968 | France | 324/557 |
| 0226392 | 8/1985 | German Dem. Rep. | 324/557 |
| 2559113 | 7/1977 | Germany | 324/557 |

OTHER PUBLICATIONS

Quality Engineering Associates: CRT-2000 Charge Roller Yest System—(brochure)—1993 (5 pages).

*Primary Examiner*—Kenneth A. Wieder
*Assistant Examiner*—Jose M. Solis

[57] ABSTRACT

The primary charge roller evaluator is a device to determine an accurate measurement of conductivity or leakage current of primary charge roller, from its steel shaft to outer coating. This measurement is based on the impedance of the roller, that is the in-phase resistance and the capacitive reactance of the roller. This measurement allows the user to evaluate the quality of the primary charge roller. This evaluation is then used to predict the performance of primary charge roller. Accurate conductivity or leakage currents are determined by totally enclosing the primary charge roller in conductive holders and applying a pre-measured pressure on roller for maximum contact. Humidity compensator adjusts for changes in humidity and has non-linear scale to adjust for patented characteristics of rollers.

2 Claims, 3 Drawing Sheets

DIAL SCALE

PRIMARY CHARGE ROLLER EVALUATOR

BACKGROUND—PRIOR STATE OF ART

1. Primary charge rollers are used in laser printer toner cartridges to help control the quality of printing. The primary charge roller is a steel shaft covered with a plastic coating to a diameter of approx. 0.50". The quality of the primary charge roller in the toner cartridge is extremely important to ensure a properly functioning toner cartridge producing a consistent product in long runs of printing.

2. The quality of primary charge rollers can in part be determined by leakage current (conductivity) between the steel shaft of the roller and the roller covering.

3. It is possible to accurately measure leakage current under controlled conditions.

4. Prior state of the art tests involve:

a. A short test run in a printer which does not prove that the primary charge roller will function properly in long runs of printing.

b. Voltage is applied, through a microammeter, to the steel shaft and the covering of the primary charge roller by means of a probe. The value is then indicated on the microammeter, (FIG. 1).

(1.) This test does not prove the quality of the primary charge rollers because readings vary at different location of the probe on the roller.

(2.) Readings vary due to differences in pressure on the probe.

(3.) Readings on microammeter vary due to changes in leakage current caused by reaction of primary charge roller to humidity changes.

FIELD OF INVENTION

To determine the quality of laser printer toner cartridge primary charge rollers.

OBJECT AND ADVANTAGES OF PRIMARY CHARGE ROLLER EVALUATOR

1. The object of primary charge roller evaluator is to determine the true and accurate quality of primary charge rollers.

a. The primary charge roller evaluator measures leakage current over the entire surface of the roller. This is accomplished by totally encasing the primary charge roller in a conductive material, the upper and lower holders. The prior state of the art, by a hand held probe, only measures leakage current at a single point or a limited number of points along the primary charge roller, not the entire surface, therefore, a substandard roller may appear acceptable based on the point(s) measured.

b. The primary charge roller evaluator provides positive premeasured consistent pressure along the entire roller via a self-locking latch to ensure proper contact and provide consistent true and accurate readings. The prior state of art, by hand held probe, had no consistent pressure and thus provided inconsistent and inaccurate measurements.

c. The primary charge roller evaluator compensates for variances in humidity. The prior state of art method does not account for changes in humidity which does affect accurate readings.

2. The advantage of the primary charge roller evaluator is that it produces true, accurate and consistent measurements to determine the actual quality of the primary charge roller.

DESCRIPTION OF DRAWINGS

1. Drawing (FIG. 1) is electrical diagram of prior state of the art.

2. Drawing (FIG. 2) is electrical diagram of primary charge roller evaluator, also showing holders (item 6 and 8) and self-locking latch (item 10).

Figure 1:
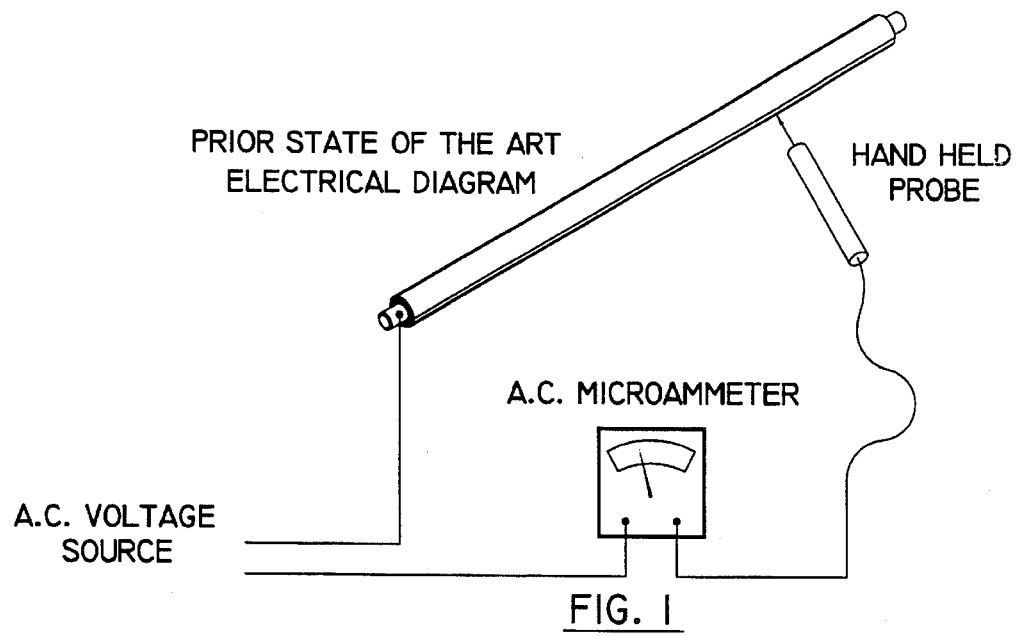
Figure 2:
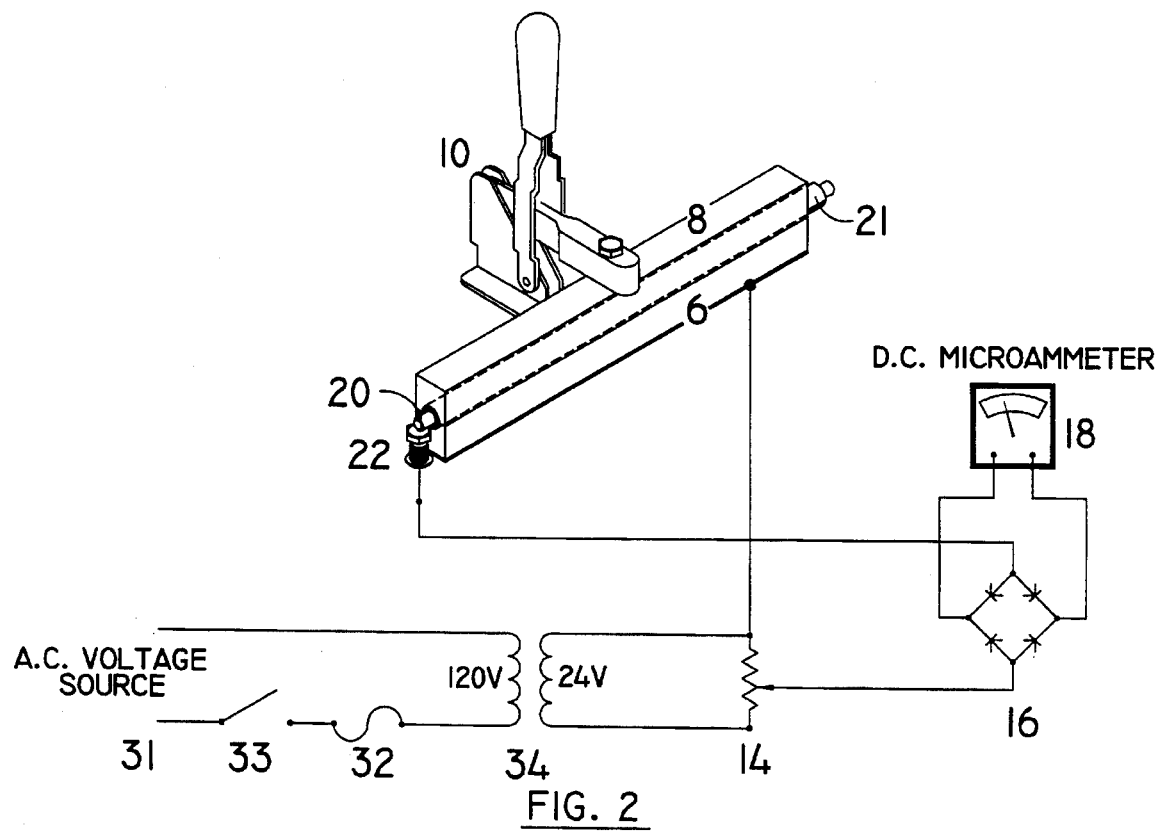
Figure 3:
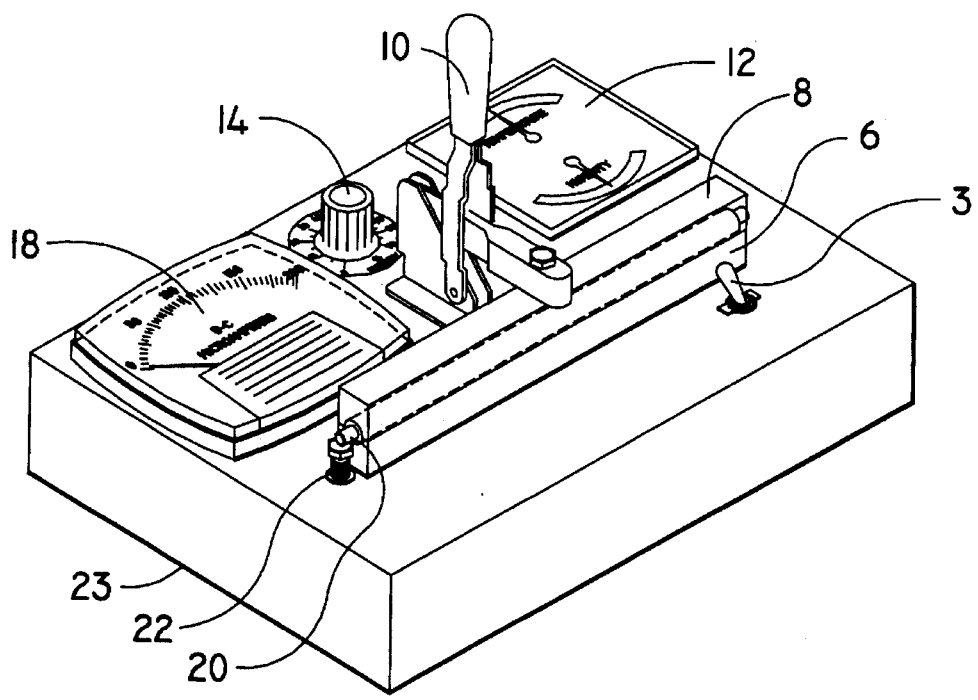

3. Drawing (FIG. 3) is primary charge roller evaluator in open position, with primary charge roller placed in lower holder (item 6).

Figure 4:
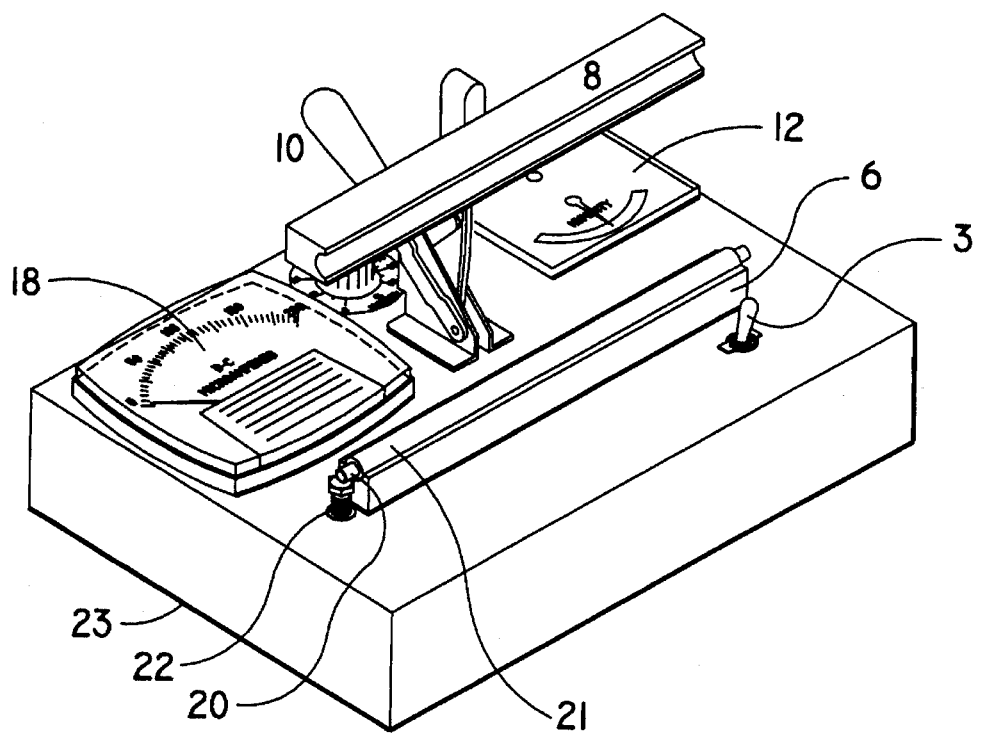

4. Drawing (FIG. 4) is primary charge roller evaluator in closed position, ready to take measurements.

Figure 5:
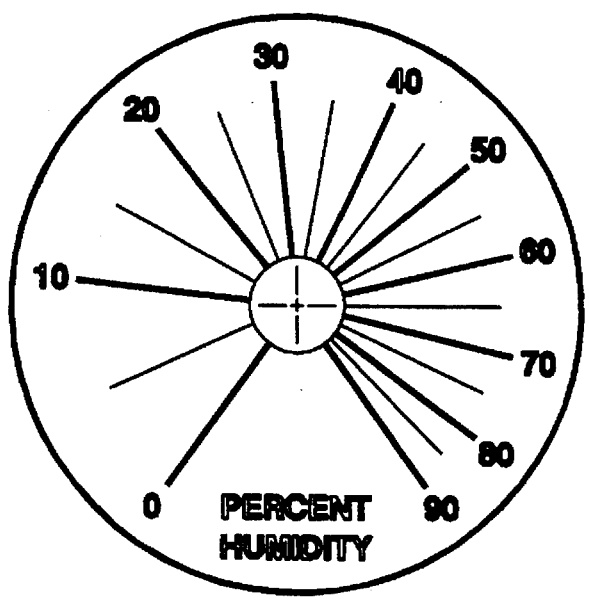

5. Drawing (FIG. 5) is the dial scale for the humidity compensation.

LIST OF REFERENCE NUMERALS

6= Lower holder (stationary).
8= Upper holder (movable).
10=Self-locking latch.
12= Humidity indicator.
14= Humidity compensator with dial calibrated in percent humidity.
16= Full-wave rectifier.
18= Direct current microammeter.
20= Steel shaft of primary charge roller.
21= Plastic covering on primary charge roller.
22= Spring loaded electrical contact.
23= Base.
31= Power cord.
32= Fuse.
33= Control switch.
34= Transformer 120 volts A.C./24 volts A.C.

SUMMARY

1. The primary charge roller evaluator solves all the variables in the prior state of the art, (1) location of the test probe, (2) pressure on test probe, and (3) changes in humidity in test area.

2. The primary charge roller evaluator measures leakage current by completely encasing the primary charge roller in conductive materials (items 6 and 8).

3. The self-locking latch (item 10) provides pre-measured positive and consistent pressure along the entire roller. This ensures proper contact between charge roller (item 21) and holders (item 6 and 8) which provides consistent true and accurate measurements.

4. The primary charge roller evaluator compensates for variances in humidity. This is accomplished by reading humidity in percent on humidity indicator (item 12) in the test area and setting the humidity compensator (item 14) to the same percent value.

5. The primary charge roller evaluator is easy and safe to operate and will produce true and accurate measurements to determine quality of primary charge rollers.

DESCRIPTION OF STRUCTURE: (FIGS. 1, 2, 3, 4)

Primary charge roller evaluator consists of:

1. Power cord (item 31) which supplies electrical power to the unit from a source.

2. Fuse (item 32) protects unit against faults, and for safety.

3. Control switch (item 33) is used to turn power "on" or "off".

4. Transformer (item 34) converts 120 volts A.C. to 24 volts A.C.

5. Humidity indicator (item 12) is used to indicate humidity in test area.

6. Humidity compensator (item 14) is used to correct measurements due to changes in humidity in test area.

7. Rectifier (item 16) is used to convert alternating leakage current to direct current.

8. Direct current microammeter (item 18) is used to indicate leakage current.

9. Lower holder (item 6) and upper holder (item 8) made of conductive material are used to completely encase the primary charge roller. This permits leakage currents to be measured over entire surface of roller 10. Self-locking latch (item 10) provides a pre-measured and consistent pressure on holders (items 6 and 8) to ensure positive and consistent contact of rollers to holders (items 6 and 8).

OPERATION OF PRIMARY CHARGE ROLLER EVALUATOR

1. Connect power cord (item 31) to wall socket, 120 volts A.C.

2. Turn control switch (item 33) to "on" position.

3. Push red handle of self locking latch (item 10) to raise upper movable holder (item 8).

4. Insert primary charge roller (item 21) into lower stationary holder (item 6) making certain the steel shaft (item 20) rests on the spring loaded electrical contact (item 22).

5. Pull red handle of self-locking latch (item 10) to lower the upper holder (item 8).

6. Make certain self locking latch (item 10) is in locked position.

7. Read humidity level on humidity indicator (item 12).

8. Turn humidity compensator (item 14) to same value as read on humidity indicator (item 12).

9. Read value as indicated on direct current microammeter (item 18) to determine the quality of the primary charge roller.

CONCLUSION

1. The primary charge roller evaluator will produce true, accurate and consistent measurements of leakage current between the steel shaft (item 20) and the plastic cover of the primary charge roller (item 21).

2. These results are obtained by completely encasing the primary charge roller (item 21 ) in a conductive material (items 6 and 8).

3. By applying pre-measured pressure to the holders (item 6 and 8) by self-locking latch (item 10) positive and proper contact is made between roller (item 21) and holders (items 6 and 8).

4. The humidity compensator (item 14) corrects for changes in humidity in test area.

5. The ability to correctly evaluate the quality of primary charge rollers will save many hours of down time for computer printers.

6. Considerable amount of time, money, and waste can be saved by accurate evaluation of primary charge rollers.

7. Shops that re-furbish printer toner cartridges can save untold labor costs, waste, and call-backs by being able to pre-determine the quality of primary charge rollers.

We claim:

1. A primary charge roller (21) insulation evaluation device comprising:

a first elongated conductive element (6) having a concave surface to mate with the roller under test:

a second elongated conductive element (8) also having a concave surface to mate with the roller under test:

pivoting member (10) adapted to move the first and second elongated conductive members respect to each other to define first and second positions:

said first position holding the first and second elongated conductive members at a distance from each other to enable the insertion and removal of the roller under test:

said second position holding the first and second elongated conductive members close to each other and applying a calibrated pressure to the roller while evaluating the roller insulation;

electrical testing means comprising a voltage source adjustable as a function of ambient humidity (14), said voltage source applied to the roller and the elongated conductive members while they are held at the second position, and a current reading meter (18) that indicates the state of the roller insulation.

2. A method to evaluate the state of the insulation in a primary charge roller (21), comprising the steps of:

providing first and second elongated conductive elements (6, 8), both having a concave surface to mate with the roller under test;

locating the roller inside both concave surfaces of said first and second elongated conductive elements while a calibrated pressure is applied by said concave surfaces to the roller and then:

measuring a current indicative of the roller insulation state while a voltage adjusted as a function of humidity (14) is applied to the roller and the elongated conductive elements.

* * * * *